United States Patent [19]

Matsuura et al.

[11] Patent Number: 4,532,373
[45] Date of Patent: Jul. 30, 1985

[54] AMORPHOUS PHOTOVOLTAIC SOLAR CELL

[75] Inventors: Hideharu Matsuura; Kazunobu Tanaka; Akihisa Matsuda; Hideyo Okushi; Hidetoshi Oheda; Satoshi Yamasaki; Nobuhiro Hata, all of Ibaraki, Japan

[73] Assignee: Agency of Industrial Science & Technology, Ministry of International Trade and Industry, Tokyo, Japan

[21] Appl. No.: 589,324

[22] Filed: Mar. 14, 1984

[30] Foreign Application Priority Data

Mar. 23, 1983 [JP] Japan ................................. 58-48301

[51] Int. Cl.³ ............................................ H01L 31/06
[52] U.S. Cl. .................................... 136/258; 136/255; 357/30; 357/65; 357/15
[58] Field of Search ........... 136/255, 258 AM; 357/2, 357/15, 30, 65

[56] References Cited

U.S. PATENT DOCUMENTS 4,064,521 12/1977 Carlson .................................. 357/2
4,142,195 2/1979 Carlson et al. ...................... 357/15
4,378,460 3/1983 Williams .............................. 136/256

Primary Examiner—Aaron Weisstuch
Attorney, Agent, or Firm—Oblon, Fisher, Spivak, McClelland & Maier

[57] ABSTRACT

An amorphous photovoltaic energy conversion element for use in a solar cell is composed of a first layer formed of a p-type material, a second layer formed of an intrinsic amorphous semiconductor having a potential gradient formed therein and a third layer formed of a metal capable of coming into ohmic contact with the aforementioned intrinsic layer of amorphous semiconductor and exhibiting a lower work function than the work function of the intrinsic layer of amorphous semiconductor.

2 Claims, 9 Drawing Figures $\phi_m < \phi_a$ $\phi_m > \phi_a$

AMORPHOUS PHOTOVOLTAIC SOLAR CELL

BACKGROUND OF THE INVENTION

1. Field of the Invention

This invention relates to an amorphous photovoltaic energy conversion element for use in an amorphous film solar cell.

2. Description of the Prior Art

The amorphous film solar cell is expected to lower fabrication costs compared with that for single-crystalline photovoltaic energy conversion elements and to enjoy a steady growth in demand. Therefore, the amorphous photovoltaic energy conversion element is attracting mounting attention for use in an amorphous film solar cell.

At first, the photovoltaic energy conversion element was developed as a p-n junction element of two-layer construction. However, the amorphous film p-n junction element has the disadvantage that it fails to provide photovoltaic energy conversion with high efficiency because only carriers generated in the depletion layer by the incident light are converted into electric power.

As an improvement in the aforementioned two-layer element, there has been proposed a three-layer element having an intrinsic layer (i-layer) of amorphous semiconductor interposed between a p-layer and an n-layer, and in the intrinisic layer, carriers generated by the light are converted into electric power (D. E. Carlson et al, *Applied Physics Letters*, Vol. 28, No. 11, June 1, 1976).

In the three-layer element of the foregoing description, when the second layer constituting an intermediate layer forms a built-in potential of required gradient throughout the entire length thereof, as illustrated in FIG. 1, this i-layer will be wholly utilizable, thereby implying that the efficiency of photovoltaic energy conversion will theoretically be appreciably improved. In the figure, $E_f$ denotes Fermi level.

Also, in such a three-layer construction as described above, the materials for layer I and layer III and physical and electrical properties thereof are chosen consistent with the theory that this three-layer element is an advanced version of the p-n junction element. As a natural consequence, a p-type material has been selected for layer I and an n-type material has been selected for layer III. This selection has never been brought into question.

Besides, in the actual manufacture of an amorphous photovoltaic conversion element of this nature, layer III (the n-layer) is generally formed last during the process of depositing the three layers. It may be safely concluded that this sequence of formation of the three layers will not be changed at least for the time being.

A conventional amorphous film solar cell fabricated under such restrictions regarding the selection of materials and the mode of production is illustrated in FIG. 2. Referring to this diagram, a solar cell 8 is completed by first forming a transparent electrode 6 on a glass substrate 5 and thereafter superposing an amorphous photovoltaic energy conversion element 1 on the transparent electrode. To be more specific, it has been customary to form an amorphous film solar cell 8 as a whole by superposing a p-layer 2 as layer I and an i-layer 3 as layer II in the order mentioned on the transparent electrode 6 and superposing an n-layer 4 as layer III on the i-layer 3, thereby producing the amorphous photovoltaic energy conversion element 1, and thereafter forming a suitable metal film 7 on the n-layer 4 in ohmic contact therewith. The incident light 1 passes through the glass substrate 5 and the transparent electrode 6 and enters the i-layer from the p-layer side. Unfortunately, the conventional amorphous photovoltaic energy conversion element 1 constructed as described above has the drawbacks mentioned below.

(1) Since amorphous semiconductors are readily affected by impurities, the separate formation of the p-, i-, and n-layers requires the use of a separate film-forming chamber for each of the three layers. Further, in the conventional construction of the three-layer element, the provision of the electrode on the n-layer side requires the formation of a metal film. Thus, the procedure and the equipment for the production become complicated.

(2) For layer III which borders on the i-layer, an n-type semiconductor has been selected, as already mentioned. Since the n-layer is devoid of any built-in potential gradient, the electron-hole pairs generated in this layer are not able to separate but recombine despite the incidence of light. Thus, these electron-hole pairs cannot be utilized for output current.

(3) Even with the latest technology, the formation of the n-layer can be carried out only by use of such a highly poisonous gas as $PH_3$ and the process of producing the element consequently includes a dangerous step.

SUMMARY OF THE INVENTION

This invention was made to overcome the problems of the prior art described above and aims to provide an amorphous photovoltaic energy conversion element of improved photovoltaic energy conversion efficiency and producible by a simplified process.

To accomplish the object described above according to this invention, there is provided an amorphous photovoltaic energy conversion element comprising first, second, and third layers formed in a sequentially superposed construction, using an intrinsic amorphous semiconductor layer as the second layer, and allowing the intrinsic layer to form therein a built-in potential gradient, which amorphous photovoltaic energy conversion element is characterized by the third layer superposed on the intrinsic amorphous semiconductor layer which constitutes the second layer being formed of a metal layer capable of coming into ohmic contact with the intrinsic amorphous semiconductor layer and exhibiting a lower work function than the work function of the intrinsic amorphous semiconductor layer.

When the third layer of the amorphous photovoltaic energy conversion element is formed not of an n-layer as described above but of a metal layer having a lower work function than the intrinsic layer, since formation of the n-layer is no longer required, the process of production of the element is simplified by the elimination of the relevant step and freed from the need to use the highly poisonous $PH_3$ gas. When a metal layer of which the element is formed has a high reflection factor, the element exhibits a notable improvement in photovoltaic energy conversion efficiency.

Other objects and characteristics of this invention will become apparent as the further disclosure of the invention is made in the following detailed description of an embodiment with reference to the accompanying drawings.

DESCRIPTION OF PREFERRED EMBODIMENT

Figure 1:
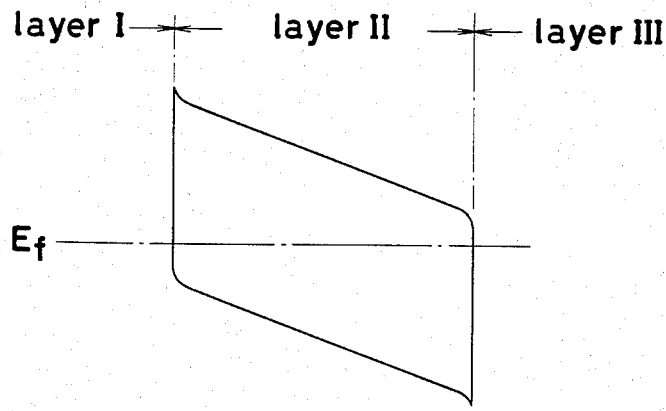
FIG. 1 is an explanatory diagram of built-in potential of an energy band structure desired to be present in an amorphous photovoltaic energy conversion element.
Figure 2:
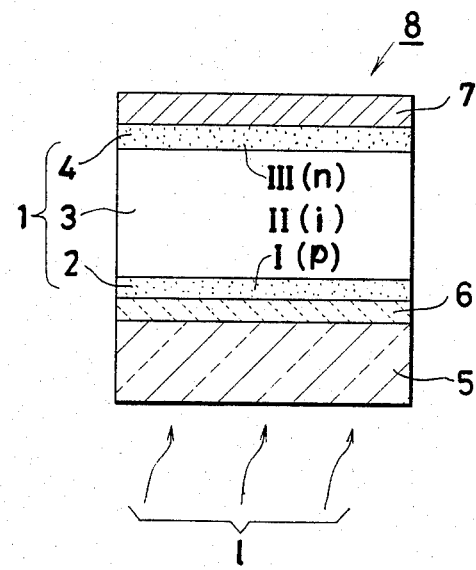
FIG. 2 is a schematic structural diagram of an amorphous film solar cell using a conventional amorphous photovoltaic energy conversion element.

This invention has grown out of a refusal to accept the established thinking described above and its accomplishment started with a study of the energy band diagram illustrated in FIG. 1. This study raised doubts as to the wisdom of the established limitation on the materials of layer I and layer III, particularly that on the nature of layer III, which is the last formed in the fabrication of the element and which has constituted the main cause for the various drawbacks suffered to date with the n-type semiconductor layer. It also generated interest in the possibility of creating the required built-in potential in layer II as illustrated in FIG. 1 by using another material and in the possibility of simplifying the process of fabrication of the element. Investigation into this possibility led to the completion of this invention. More specifically, the present invention resides in causing at least layer III, the final layer formed in the fabrication of the amorphous photovoltaic energy conversion element of the construction described above, to be formed of a metal which has a lower work function, $\phi m$, than the work function, $\phi a$, of the intrinsic amorphous semiconductor layer (i-layer) serving as layer II in the element. Now, the present invention and the principle behind it will be described below with reference to FIG. 3 and the subsequent drawings.

Figure 3A:
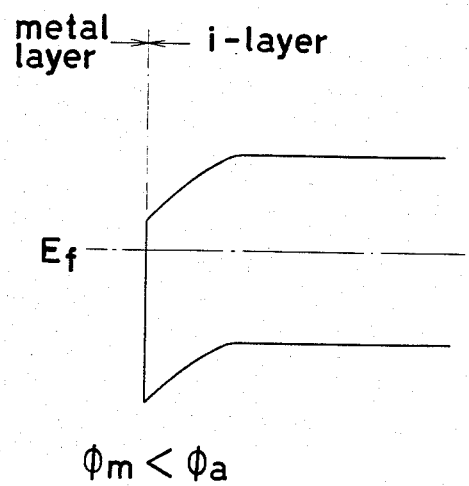
FIG. 3(A) is an explanatory diagram of the energy bands which occur when, in an amorphous photovoltaic energy conversion element, layer III is formed of a metal having a lower work function than the substance of layer II.

In the bonding of a metal layer with an intrinsic amorphous semiconductor layer (i-layer), the curve of the energy band near the interface between the two layers will be as shown in FIG. 3(A) where the work function, $\phi a$, of the aforementioned i-layer and the work function, $\phi m$, of the metal layer satisfy the relation $\phi m < \phi a$. In the drawing, $E_f$ denotes the Fermi level.

Figure 3B:
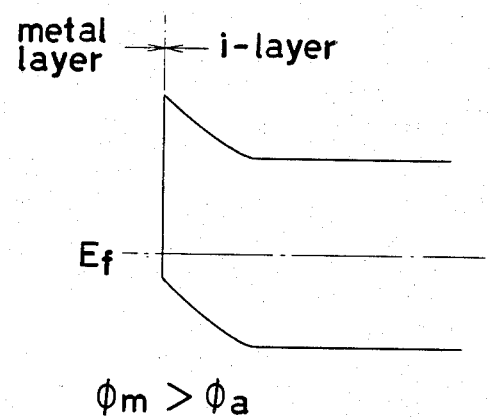
FIG. 3(B) is an explanatory diagram of the energy bands which occur when layer III is formed of a metal having a higher work function than the substance of layer II.

On the other hand, where the work function, $\phi m$, of the metal layer used satisfies the relation, $\phi m > \phi a$, the curve of the energy band near the interface between the two layers will be as shown in FIG. 3(B). Although the diagrams of FIGS. 3(A) and 3(B) are reversed in the lateral direction, interpretation of FIGS. 3(A) and 3(B) with reference to FIG. 1 reveals that, in the case of FIG. 3(A), namely where the work function, $\phi m$, of the metal layer to be used is lower than the work function, $\phi a$, of the i-layer, the desired energy band structure illustrated in FIG. 1 can be obtained by using a metal layer satisfying this relationship of work function in place of the conventional n-layer.

Examples of metals satisfying the aforementioned relationship of work function relative to the generally adopted intrinsic amorphous semiconductor layer such as, for example, a hydrogenated amorphous Si (a-Si:H) semiconductor layer, which was confirmed by measurement to have a work function of 4.65 eV, are quite numerous and can be listed as Li, Be, Na, Mg, K, Ca, Sc, Ti, Mn, Ga, Rb, Sr, Y, Zr, Nb, In, Cs, Ba, metals of the lanthanide series, Hf, Tl, Pb, Fr, Ra, and metals of the actinide series, and alloys using such metals as principal components. The term "intrinsic amorphous semiconductor" as contemplated by this invention is defined in its broad sense. Thus, it embraces microcrystalline mixed-phase semiconductors.

Based on the knowledge mentioned above, the inventors conducted the following test.

Figure 4:
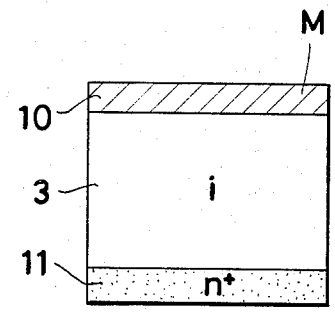
FIG. 4 is a schematic diagram of the basic configuration of an amorphous photovoltaic energy conversion element of the present invention.

From among the various metals enumerated above, Mg, having a work function of about 3.8 eV, was selected as a relatively stable metal capable of being readily applied. As the material for the intrinsic layer of amorphous semiconductor, the aforementioned a-Si:H was selected. For the purpose of confirming whether or not layers II and III formed of intrinsic amorphous silicon and one of the above mentioned metals, respectively, could form the required ohmic contact in the amorphous photovoltaic energy conversion element as shown in FIG. 4, an i-layer 3 was formed on an n+-layer of single-crystal semiconductor 11 which is used as an electrode and a Mg layer 10 was formed on the upper side of the i-layer 3. The test element thus obtained was tested for its voltage-current characteristic. The results of the test indicated that the i-layer 3 and the n+-layer of single-crystal semiconductor 11 had formed a satisfactory ohmic contact.

Figure 5:
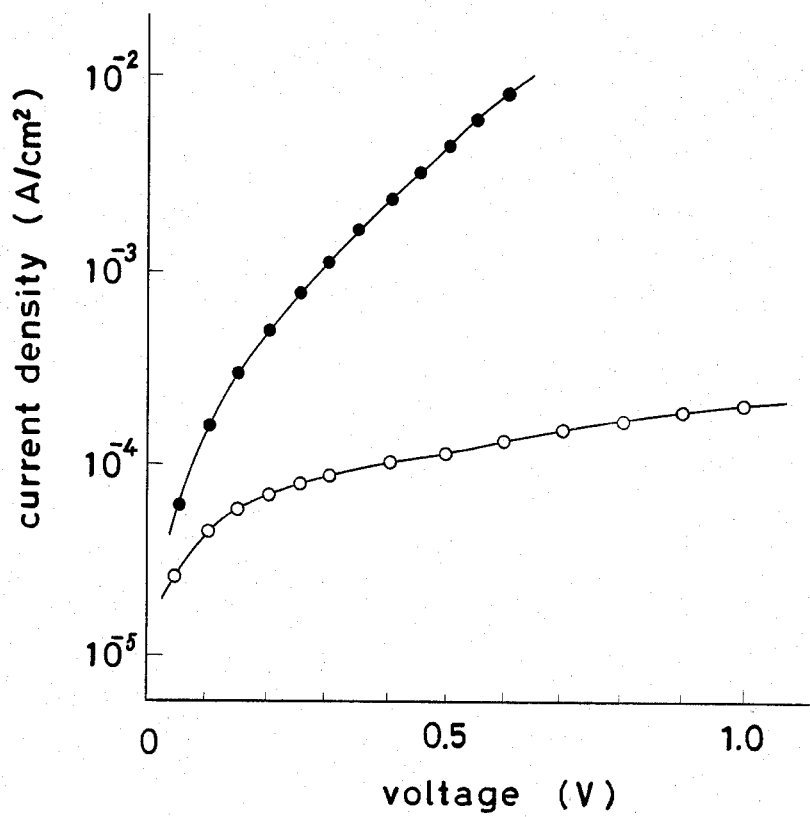
FIG. 5 is a graph showing the voltage-current characteristic of the element of FIG. 4.

The voltage-current characteristics of the test element were as illustrated in FIG. 5. The curve containing the solid circles represents the characteristic obtained by applying negative voltage to the Mg side and the curve containing the open circles the characteristic obtained by applying positive voltage to the Mg side. From the data, it is noted that the current reached saturation when the positive voltage was applied to the Mg side.

From this it was inferred that the energy bands formed by the junction between the Mg layer and the i-layer were as illustrated in FIG. 3(A). It was therefore concluded that the energy band as illustrated in FIG. 1 and required for the amorphous photovoltaic energy conversion element for use in the amorphous film solar cell would be satisfied by using a Mg layer for the layer III in that element.

It is further noted from FIG. 5 that an amply large current can be safely passed through the ohmic contact between the i-layer and the Mg layer, the metal layer contemplated by this invention. Further, the amount of current which the ohmic contact can tolerate is greater than the highest current which can be tolerated by any ohmic contact formed between the i-layer and an n+-layer heretofore reported. From the test data, it can be concluded that the ohmic contact formed between the Mg layer and the i-layer in accordance with this invention exhibits very satisfactory properties.

Figure 6:
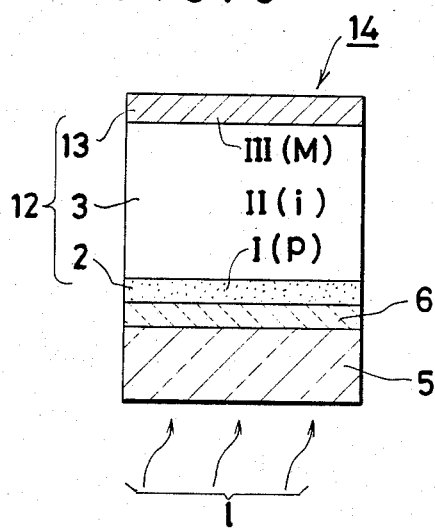
FIG. 6 is a schematic diagram of a typical solar cell using an amorphous photovoltaic energy conversion element of this invention.

A typical photovoltaic energy conversion element conforming to the aforementioned knowledge and principle of the present invention is illustrated in FIG. 6.

The illustrated embodiment represents the basic construction of the element. A transparent electrode 6 is formed on a glass substrate 5, then a p-layer 2 is formed as layer I, and thereafter an intrinsic layer (i-layer) 3 of amorphous semiconductor is formed. These first three steps can be conducted similarly to the corresponding steps in the procedure followed in the fabrication of the conventional element.

After the i-layer 3 is formed, layer 13 including a metal, for example Mg, which satisfies the aforementioned relationship of work function, is superposed as layer III. The metal layer 13 is formed to have a thickness in the range of 0.1 to 1.0 $\mu$m. However, a thickness of not less than 200 Å will suffice from a functional point of view. Any metal satisfying the work function relation $\phi m < \phi a$ may be used to form the metal layer 13 and comes into good ohmic contact with an i-layer. Of these metals, those having a high reflection factor will bring about a notable improvement in photovoltaic energy conversion efficiency of an amorphous photovoltaic energy conversion element. In view of this and, in addition thereto, due to their availability, price, and durability, Mg, Cs, and metals of the lanthanide series can advantageously be used as favorable metals.

In the manufacture of an amorphous film solar cell 14 using such an amorphous photovoltaic energy conversion element 12 as described above, since the film-forming device heretofore indispensable to the formation of the n-layer is no longer required, the need to use such a dangerous poisonous gas as $PH_3$ is eliminated. The Mg film can be readily formed as by vacuum evaporation at room temperature.

The present element admits the incident light 1 from the glass substrate 5 side. In the element, most of the incident light undergoes photovoltaic energy conversion. The part of the incident light which has escaped the conversion process passes through the i-layer and impinges on the metal layer. Since the Mg-layer used in the element has very high reflectivity, the unabsorbed part of the incident light is reflected and returned in the opposite direction into the i-layer. Thus, during the passage through the i-layer, the reflected light is given another chance of being absorbed and thus another chance to contribute to the generation of output current. This effect is equivalent to doubling the thickness of the i-layer and is highly effective in improving the photovoltaic energy conversion coefficient of the element to a notable extent. As already pointed out, in the conventional amorphous film solar cell, those charge carriers generated by the light absorbed in the n-layer do not contribute to the creation of output power, which makes the usefulness of this invention stand out all the more.

In the amorphous photovoltaic energy conversion element 12 of the embodiment illustrated in FIG. 6, the p-layer and the i-layer may be formed of the same material or of dissimilar materials. In the former instance, the two layers may be formed of a-Si:H. In the latter instance, the p-layer may be formed of a-SiC:H and the i-layer of a-Si:H, for example. Thus, use of dissimilar amorphous semiconductors in these two layers is allowable.

Figure 7A:
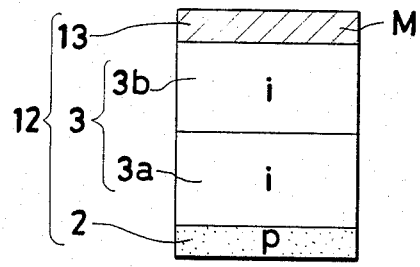
FIG. 7(A) is a schematic diagram of another typical solar cell using an amorphous photovoltaic energy conversion element of this invention.

In FIG. 7, modifications of only the amorphous photovoltaic energy conversion element 12 portion of the present invention are illustrated. First, as shown in FIG. 7(A), the intrinsic amorphous semiconductor layer 3 may comprise a plurality of superposed layers. When two layers are used therein as illustrated, a-Si:H may be selected for the lower layer 3a and a-SiGe:H/a-SiSn:H or a microcrystalline mixed-phase semiconductor such as, for example, $\mu$c-Si:H, may be selected for the upper layer 3b.

Figure 7B:
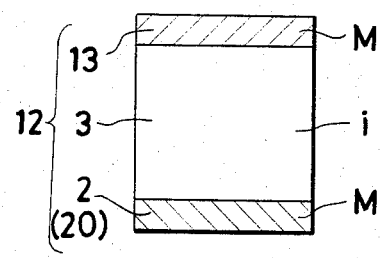
FIG. 7(B) is a schematic diagram of still another typical solar cell using an amorphous photovoltaic energy conversion element of this invention.

Further, as is evident from the principle underlying this invention depicted in FIG. 3, the layer I is formed of a metallic material having a higher work function, $\phi m$, than the work function, $\phi a$, of the intrinsic semiconductor layer, as may be surmised from FIG. 3(B), in place of the p-type semiconductor 2. A modification involving this substitution of the material for the layer I is depicted in FIG. 7(B). In the construction illustrated, the layer I is formed of a metallic material 20 satisfying the aforementioned condition. Typical examples of the metallic material 20 include Au and Pt, which forms a rectifying junction with the i-layer as well as the p-layer does. Of course, this invention has as its major object and essential concept the elimination of the n-layer which has been the cause of the various drawbacks suffered by the conventional element. Thus, in this modification, the other side of the element is constituted of a metal layer 13 having a lower work function than the intrinsic layer 3.

All embodiments cited so far represent cases involving amorphous photovoltaic energy conversion elements of the so-called single construction. The present invention can also be embodied similarly in amorphous photovoltaic energy conversion elements of the so-called tandem construction. By the tandem construction is meant a configuration in which a plurality of unit amorphous photovoltaic energy conversion elements are generally superposed in the direction of light travel. Use of the photovoltaic energy conversion elements of the present invention as at least one unit amorphous photovoltaic energy conversion element in the tandem construction will simplify the manufacturing process to a great extent.

As described in detail above, the present invention eliminates all the drawbacks suffered by the conventional element as enumerated in (1) through (3) above, simplifies the process of fabrication, and enhances the photovoltaic energy conversion efficiency. Thus being effective in producing highly desirable results, this invention will contribute greatly to the growth of amorphous photovoltaic energy conversion elements using junctions of the type of interest and of amorphous film solar cells using such elements.

What is claimed is:

1. An amorphous photovoltaic energy conversion element for use in a solar cell, which comprises sequentially superposed first, second, and third layers, said first layer being formed of p-type material, said second layer being formed of an intrinsic amorphous semiconductor which has a potential gradient therein, and said third layer being formed of a metal which comes into ohmic contact with said second layer of intrinsic amorphous semiconductor and exhibits a work function lower than the work function of said second layer of intrinsic amorphous semiconductor.

2. An amorphous photovoltaic energy conversion element according to claim 1, wherein said third layer of metal is formed of magnesium.

* * * * *